US010068745B2

(12) United States Patent
Yaguchi et al.

(10) Patent No.: US 10,068,745 B2
(45) Date of Patent: Sep. 4, 2018

(54) CHARGED PARTICLE BEAM DEVICE AND SAMPLE HOLDER FOR CHARGED PARTICLE BEAM DEVICE

(71) Applicant: Hitachi High-Technologies Corporation, Minato-ku, Tokyo (JP)

(72) Inventors: Toshie Yaguchi, Tokyo (JP); Yasuhira Nagakubo, Tokyo (JP); Toshiyuki Iwahori, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 15/023,429

(22) PCT Filed: Sep. 5, 2014

(86) PCT No.: PCT/JP2014/073431
§ 371 (c)(1),
(2) Date: Mar. 21, 2016

(87) PCT Pub. No.: WO2015/053020
PCT Pub. Date: Apr. 16, 2015

(65) Prior Publication Data
US 2016/0217971 A1 Jul. 28, 2016

(30) Foreign Application Priority Data
Oct. 7, 2013 (JP) ................................ 2013-209795

(51) Int. Cl.
*H01J 37/20* (2006.01)
*H01J 37/32* (2006.01)
*H01J 37/16* (2006.01)

(52) U.S. Cl.
CPC .............. *H01J 37/20* (2013.01); *H01J 37/16* (2013.01); *H01J 37/32862* (2013.01);
(Continued)

(58) Field of Classification Search
CPC ......... H01J 2237/184; H01J 2237/2002; H01J 2237/2003; H01J 37/16; H01J 37/20; H01J 37/32862
See application file for complete search history.

(56) References Cited

U.S. PATENT DOCUMENTS 4,665,315 A * 5/1987 Bacchetti ................ H01J 37/02
250/424
5,326,971 A * 7/1994 Theodore ................ H01J 37/20
250/311

(Continued)

FOREIGN PATENT DOCUMENTS

JP 59-62662 U 4/1984
JP 9-129168 A 5/1997

(Continued)

OTHER PUBLICATIONS

International Search Report (PCT/ISA/210) issued in PCT Application No. PCT/JP2014/073431 dated Nov. 11, 2014, with English translation (four (4) pages).

(Continued)

*Primary Examiner* — Wyatt Stoffa
(74) *Attorney, Agent, or Firm* — Crowell & Moring LLP

(57) ABSTRACT

The purpose of the present invention is to provide a charged particle beam device and a sample holder for the charged particle beam device by which it is possible to form various environments, and perform in-situ observation and analysis without removing a sample from the charged particle beam device. In the present invention, inserting a detachable reverse side entry portion from a side facing a sample holding means, said portion being provided with a function for changing the state of a sample attached to the sample holding means, makes it possible to observe/analyze changes in the sample by a different process without removing the sample from the charged particle beam device by (Continued)

combining a reverse side entry portion having a different function with the sample holding means. The reverse side entry portion comprises two parts, and a tip thereof, which is one of the parts, is removable. After mounting the reverse side entry portion onto the sample holding means, the sample can be transported while maintaining the same atmosphere, and the sample can be transported between different devices without exposing the sample to air.

10 Claims, 10 Drawing Sheets

(52) U.S. Cl.
CPC . *H01J 2237/184* (2013.01); *H01J 2237/2002* (2013.01); *H01J 2237/2003* (2013.01)

(56) References Cited

U.S. PATENT DOCUMENTS

| | | | | |
|---|---|---|---|---|
| 5,606,168 A * | 2/1997 | Chiron | ..................... | G01N 3/04 |
| | | | | 250/443.1 |
| 5,986,270 A * | 11/1999 | Bormans | ................. | H01J 37/20 |
| | | | | 250/442.11 |
| 6,576,910 B2 * | 6/2003 | Hashikawa | ............. | H01J 37/20 |
| | | | | 250/442.11 |
| 6,674,076 B1 * | 1/2004 | Orfino | ................ | G01N 23/2251 |
| | | | | 250/306 |
| 8,349,125 B2 * | 1/2013 | Vane | ..................... | B08B 7/0035 |
| | | | | 156/345.43 |
| 8,604,429 B2 * | 12/2013 | Yaguchi | .................. | H01J 37/20 |
| | | | | 250/306 |
| 8,878,144 B2 * | 11/2014 | Yaguchi | .................. | H01J 37/20 |
| | | | | 250/440.11 |
| 2005/0061971 A1 * | 3/2005 | Terada | ............... | G01N 23/2251 |
| | | | | 250/307 |
| 2008/0093565 A1 * | 4/2008 | Yaguchi | .................. | H01J 37/16 |
| | | | | 250/440.11 |
| 2008/0179518 A1 | 7/2008 | Creemer et al. | | |
| 2011/0032611 A1 * | 2/2011 | Mick | ....................... | H01J 37/20 |
| | | | | 359/395 |
| 2011/0303845 A1 * | 12/2011 | Yaguchi | .................. | H01J 37/20 |
| | | | | 250/310 |
| 2013/0032732 A1 * | 2/2013 | Safar | ..................... | H01J 37/185 |
| | | | | 250/442.11 |
| 2013/0040400 A1 * | 2/2013 | Konings | ................. | G01Q 30/12 |
| | | | | 436/164 |
| 2013/0213439 A1 | 8/2013 | Zandbergen et al. | | |

FOREIGN PATENT DOCUMENTS

| | | |
|---|---|---|
| JP | 2000-505944 A | 5/2000 |
| JP | 2000-208083 A | 7/2000 |
| JP | 2001-6591 A | 1/2001 |
| JP | 2003-187735 A | 7/2003 |
| JP | 2008-512841 A | 4/2008 |
| JP | 2009-117196 A | 5/2009 |
| JP | 2009-283477 A | 12/2009 |
| JP | 2013-41823 A | 2/2013 |
| JP | 2013-171836 A | 9/2013 |

OTHER PUBLICATIONS

Japanese-language Office Action issued in counterpart Japanese Application No. 2013-209795 dated Jun. 13, 2017 with English translation (Seven (7) pages).

* cited by examiner

CHARGED PARTICLE BEAM DEVICE AND SAMPLE HOLDER FOR CHARGED PARTICLE BEAM DEVICE

TECHNICAL FIELD

The present invention relates to a charged particle beam device for observing a sample (also called a specimen) using a charged particle beam and a sample holder (also called a specimen holder) for the charged particle beam device.

BACKGROUND ART

In a charged particle beam device, in addition to observing a sample at room temperature, a method of making an "in-situ" observation of changes of a sample by heating to a high temperature, cooling, applying a voltage or a pressure, or applying a pulling-stress is known. Also, a method of making an "in-situ" observation of how a sample changes in a reactant gas atmosphere to come to actual conditions as close as possible is known.

Regarding the observation in a gas atmosphere, as described in PTLs 1 and 2, a method of sandwiching a sample between two grids and providing a mechanism to introduce a gas to therebetween and exhaust a gas therefrom is known.

Also, as described in PTL 3, a method of providing a tubular cover around a sample and providing two holes in the cover for an electron beam to pass through to enhance differential pumping is known.

Regarding the observation in a gas atmosphere or a liquid atmosphere, as described in PTL 4, a method of arranging a membrane, a portion of which is transparent, at a fixed mutual distance, supplying a fluid to between membranes, providing a mechanism to heat the membrane, the fluid between the membranes, and a sample, a heating element thereof is housed inside or on the membrane, and the sample is placed on the heating element is known.

Also, as described in PTL 5, a method of observing a gas reaction at high temperature by providing a capillary tube to blow a gas facing a heater to heat a sample is known.

In another conventional technology, like in PTL 6, a method of cooling and observing a sample by providing a refrigerant tank that stores a refrigerant to cool the sample near a sample holder is known.

CITATION LIST

Patent Literature

PTL 1: JP 2009-117196 A
PTL 2: JP 9-129168 A
PTL 3: U.S. Pat. No. 5,326,971
PTL 4: JP 2008-512841 A, International application PCT/NL2005/000662
PTL 5: JP 2003-187735 A
PTL 6: JP 2000-208083 A

SUMMARY OF INVENTION

Technical Problem

In all of the conventional technologies described in PTLs 1 to 6, a sample holder which holds a sample is equipped with the function of heating and the like and no consideration is given to the possibility of having the function outside the sample holder. Thus, when a combination experiment of many capabilities should be conducted, a problem of the limited number of capabilities that can be equipped is posed. In addition, by equipping the sample holder with various kinds of capabilities, the sample holder increases in size, posing a problem of being more likely to be subject to vibration, making high-resolution observations more difficult.

In addition, the above conventional technologies relate all to observations under vacuum or in a liquid when heated, cooled, a voltage or pressure is applied, or pulling-stress is applied and no consideration is given to cleaning of a sample and a sample holder.

Thus, for example, a charged particle beam device and a sample holder for the charged particle beam device that can be used for static observations under normal vacuum, allows an in-situ observation in a special atmosphere of a gas, a liquid or the like in a combination of various functions added to the sample holder and various removable functions separately added to sample chamber of the charged particle beam device while heating, cooling, applying a voltage or pressure, or applying pulling-stress to the sample without damaging the main body of the charged particle beam device, and further allows implementation of various functions without re-placing the sample in different environments by combining different functions such as cleaning of the sample and the sample holder are demanded.

In consideration of the above, an object of the present invention is to provide a charged particle beam device capable of forming various environments and making in-situ observations and analyses without taking out a sample from the charged particle beam device and a sample holder for the charged particle beam device.

Solution to Problem

To achieve the above object, the present invention adopts the configuration described in claims. The configuration is, for example, as described below.

To solve one of the above problems, a removable reverse side entry portion including a different function is inserted into a sample holder inserted into a sample chamber of a charged particle beam device.

Also, to solve one of the above problems, as a function to change a state of a sample provided in the removable reverse side entry portion, two pairs or more of electrode terminals are included to apply a voltage to the sample and when combined with a sample holding means, are arranged in a portion fixing a micro-sample of a sample holding portion or the neighborhood thereof to be connected to the micro-sample by a metal wire or the like and the electrode terminals are connected to a voltage applying power source outside an electron microscope.

Also, to solve one of the above problems, the removable reverse side entry portion is provided with a gas injection mechanism.

Also, to solve one of the above problems, the removable reverse side entry portion is provided with a sample atmosphere blocking function surrounding the sample holding portion and capable of blocking an atmosphere between a sample chamber and the sample, being removed from the sample holder and the sample chamber of the charged particle beam device and also evacuating.

Also, to solve one of the above problems, the removable reverse side entry portion is provided with the sample atmosphere blocking function surrounding the sample holding portion and capable of blocking the atmosphere between the sample chamber and the sample, a cell membrane of a light-element thin film is included, in a sample atmosphere blocking portion, and when combined with the sample holding means, the cell membrane is arranged on a charged particle axis.

Also, to solve one of the above problems, the removable reverse side entry portion is provided with a micro vacuum gauge.

Also, to solve one of the above problems, the removable reverse side entry portion is provided with a temperature-humidity sensor.

Also, to solve one of the above problems, the removable reverse side entry portion is provided with the sample atmosphere blocking function surrounding the sample holding portion and capable of blocking the atmosphere between the sample chamber and the sample, an electrode plate facing an inner side of the sample atmosphere blocking portion is provided, a control unit is connected to one electrode via a high frequency generator, another electrode is installed, and a sample portion of the sample holder is arranged between the electrodes.

Also, to solve one of the above problems, the removable reverse side entry portion is provided with a stress applying function to apply stress.

Also, to solve one of the above problems, the removable reverse side entry portion is provided with a gear arranged so as to mesh with a micro-gear mounted on a sample support of the sample holder.

Also, to solve one of the above problems, the tip portion of the reverse side entry portion, which can be divided into two portions in the sample chamber of the charged particle beam device, is removably mounted on the side of the sample holder of the removable reverse side entry portion.

Also, to solve one of the above problems, the removable reverse side entry portion is provided with a function to cool the tip portion of the sample holder.

Advantageous Effects of Invention

According to the present invention, changes of a sample in different processes can be observed and analyzed without removing the sample from a charged particle beam device by combining a reverse side entry portion having a different function and a sample holder having a different function. In addition, after a reverse side entry portion tip portion is attached to the sample holder, the sample holder can be transported while an atmosphere is maintained.

BRIEF DESCRIPTION OF DRAWINGS

FIGS. 3A and 3B show the reverse side entry portion 17 and the sample holder 6 with a gas injection mechanism and a voltage applying mechanism according to an embodiment.

DESCRIPTION OF EMBODIMENTS

Figure 1:
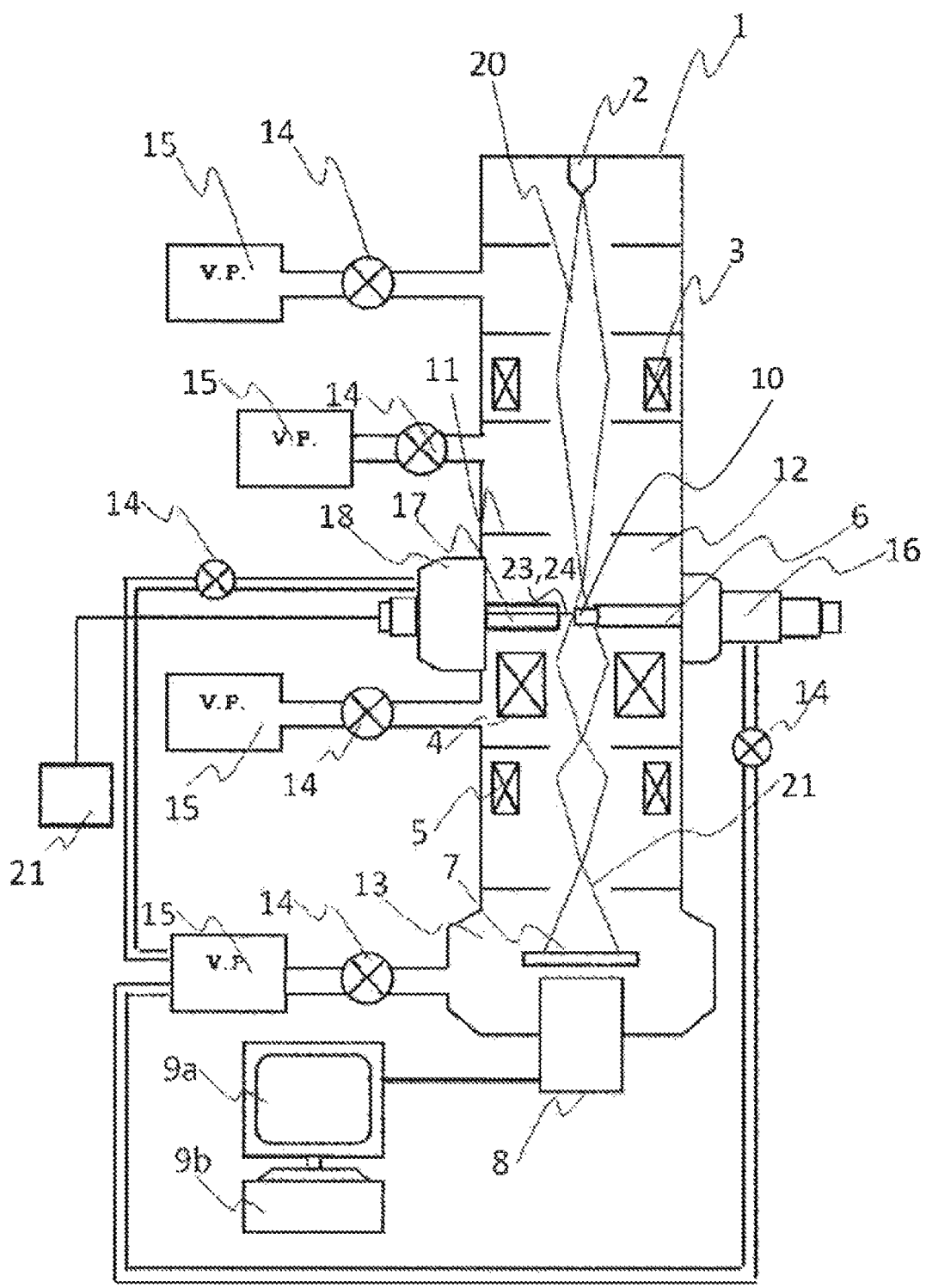
FIG. 1 is a basic configuration diagram of an electron microscope 1 as an embodiment of the present invention.

In FIG. 1, a basic configuration diagram of an electron microscope 1 as an embodiment of the present invention is shown. A column of the electron microscope 1 includes an electron gun 2, a condenser lens 3, an objective lens 4, and a projector lens 5. A sample holder for electron microscope 6 is inserted between the objective lenses 4. A fluorescent screen 7 is mounted below the projector lens 5 and a TV camera 8 is mounted below the fluorescent screen 7. The TV camera 8 is connected to an image recording unit 9b via an image display unit 9a. A sample 10 is held in the tip portion of the sample holder for electron microscope 6. An aperture 11 for differential pumping is arranged between the condenser lens 3 and the objective lens 4. A space between the electron gun 2 and the condenser lens 3, a space between the condenser lens 3 and the objective lens 4, an electron microscope sample chamber 12, and an observation chamber 13 are each connected to different vacuum pumps 15 via a valve 14.

A sample pre-evacuation chamber 16 is set up in the electron microscope sample chamber 12 and the sample pre-evacuation chamber 16 is connected to the vacuum pump 15 via the valve 14. The reverse side entry portion 17 inserted into the electron microscope sample chamber 12 facing the sample holder 6. In the electron microscope sample chamber 12, a reverse side entry pre-evacuation chamber 18 is mounted facing the sample pre-evacuation chamber 16. The reverse side entry pre-evacuation chamber 13 is connected to the vacuum pump 15 via the valve 14. Before the reverse side entry portion 17 is inserted into the sample chamber 12, air in the reverse side entry portion 17 and the reverse side entry pre-evacuation chamber 18 is exhausted from the reverse side entry pre-evacuation chamber 18 using the vacuum pump 15 for insertion into the sample chamber 12. Various capabilities may be added to the reverse side entry portion 17 so that the reverse side entry portion 17 can be replaced according to the purpose of observation. In FIG. 1, the reverse side entry portion 17 has a voltage applying mechanism to the sample 10 and is connected to a voltage applying power source 19.

An incident electron beam 20 generated by the electron gun 2 is converged by the condenser lens 3 before the sample 10 is irradiated therewith. A transmitted electron beam 21 having transmitted the sample 10 is formed as an image by the objective lens 4 and the image is enlarged by the projector lens 5 before being projected onto the fluorescent screen 7. Alternatively, the fluorescent screen 7 is lifted to project the image onto the TV camera 8 and a transmitted image is displayed in the image display unit 9a and recorded in the image recording unit 9b. The sample holder 6 has electrodes 23 so as to come into contact with both ends of the sample 10. The reverse side entry portion. 17 has electrodes 24 to apply a voltage to the sample 10. A voltage is applied to the sample 10 by bringing the respective electrodes 23, 24 into contact. A transmitted image of the sample 10 during application of the voltage is captured by the TV camera 8 and recorded in the image recording unit 9b.

Figure 2A:
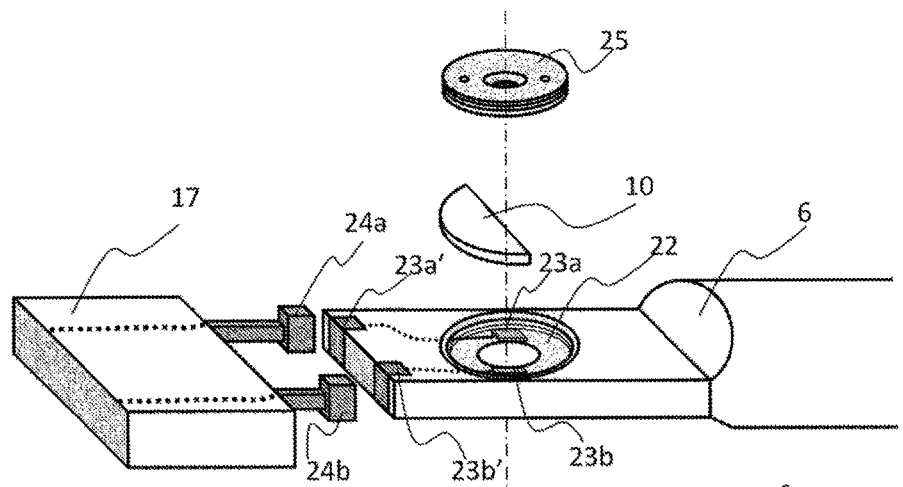
FIGS. 2A and 3B are basic configuration diagrams of a tip portion of a sample holder for electron microscope 6 and a tip portion of a reverse side entry 17 according to an embodiment.
Figure 2B:
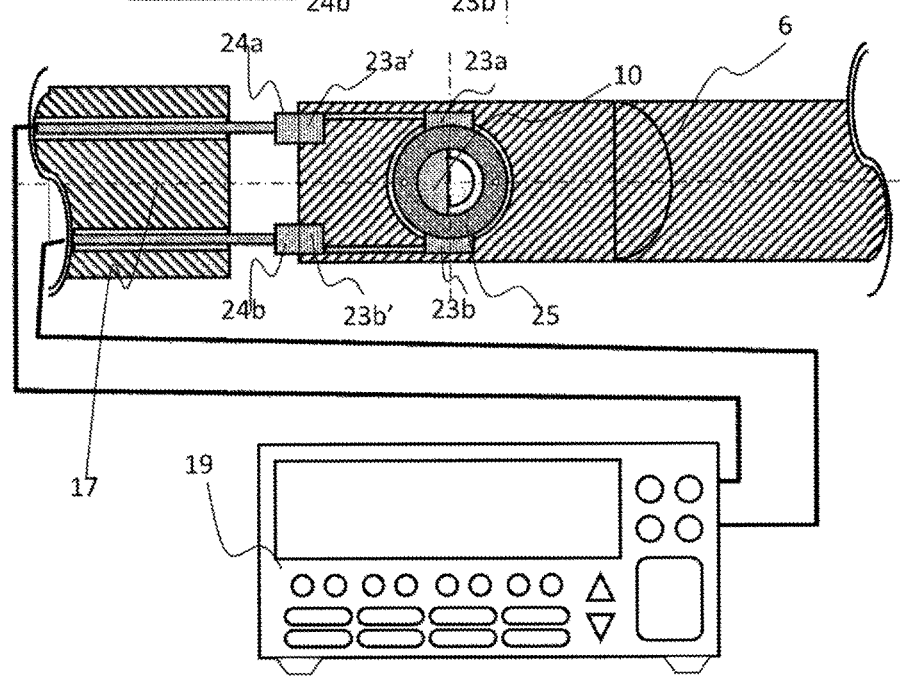

FIGS. 2(a) and 2(b) show basic configuration diagrams of the tip portion of the sample holder for electron microscope 6 and the tip portion of the reverse side entry 17 according to an embodiment of the present invention. A sample contact portion 22 of the sample holder 6 on which the sample 10 is placed is made of an insulating material and electrodes 23a, 23b are provided on both side thereof and in contact with both sides of the sample 10. The sample 10 is fixed to the sample holder 6 by a sample presser foot 25 made of or coated with an insulating material. The sample presser foot 25 is a screw-in type and is fixed to the sample holder 6. Electrodes 24a, 24b of movable type are fixed from the reverse side entry portion 17 so as to be in contact with electrodes 23a', 23b' of the sample holder 6. The electrodes 24a, 24b are connected to the voltage applying power source 19. Accordingly, the weight reduction of the sample holder 6 can be achieved so that the influence such as vibration can be reduced. Due to a decreased size, the high resolution objective lens 4 with a narrow gap can be used and changes when a voltage is applied can be observed in high resolution.

Figure 3A:
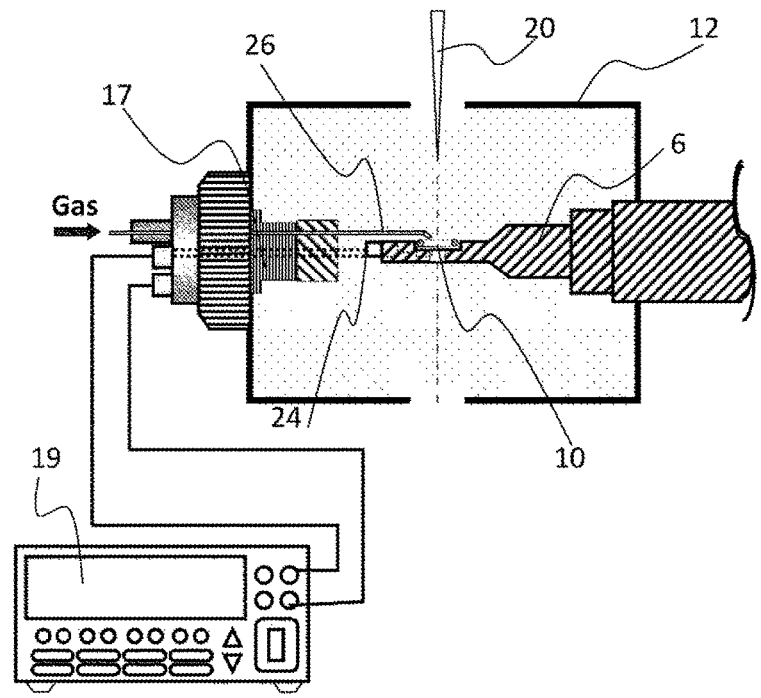
Figure 3B:
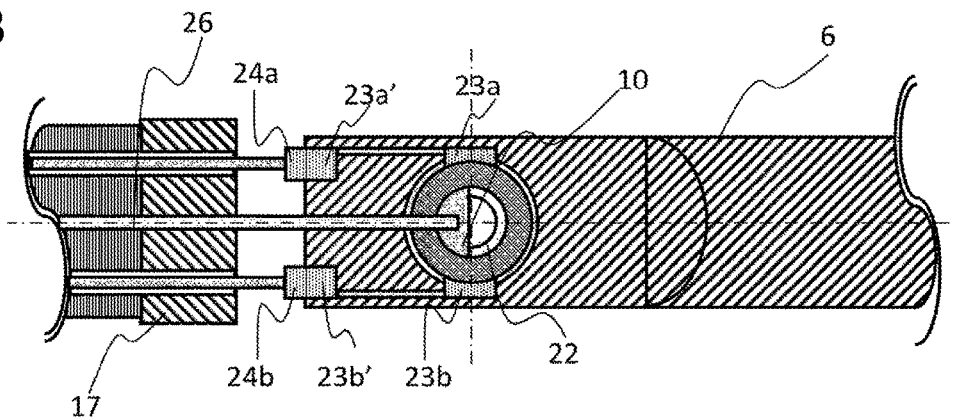

FIGS. 3(a) and 3(b) show the reverse side entry portion 17 and the sample holder 6 with a gas injection mechanism and a voltage applying mechanism as an embodiment. FIG. 3(a) is a configuration diagram and FIG. 3(b) is a top view. The reverse side entry portion 17 includes a gas injection nozzle 26 to inject a gas into the neighborhood of the sample 10 and a gas is injected from outside the sample chamber 12. The gas injection nozzle 26 can be inserted into the neighborhood of an observation region of the sample 10 so that a sample reaction field can efficiently be created. By injecting a gas and applying a voltage to the sample 10, changes occurring in the sample 10 in any gas atmosphere while the voltage is applied can be observed. In addition, by injecting a gas after applying a voltage and observing the sample 10 in advance before the gas is injected, the influence of the gas can be known.

Figure 4A:
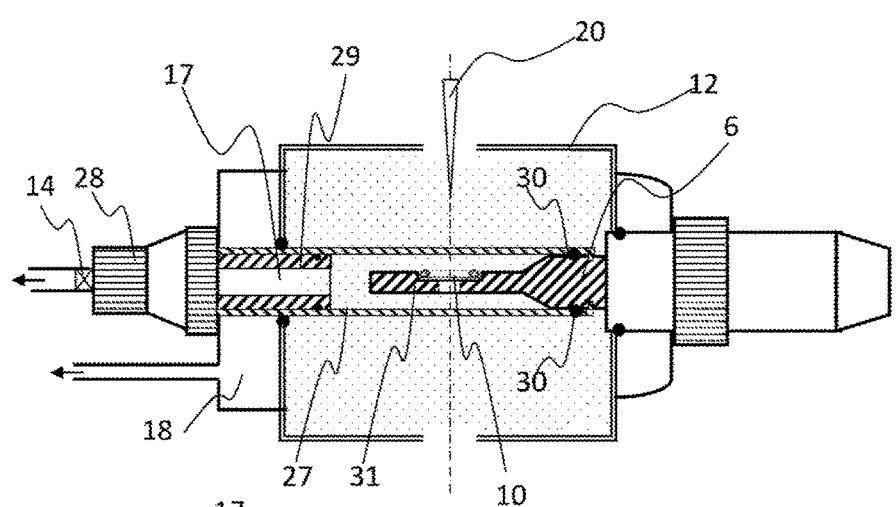
FIGS. 4A to 4C show the reverse side entry portion 17 and the sample holder 6 with a sample atmosphere blocking mechanism according to an embodiment.
Figure 4B:
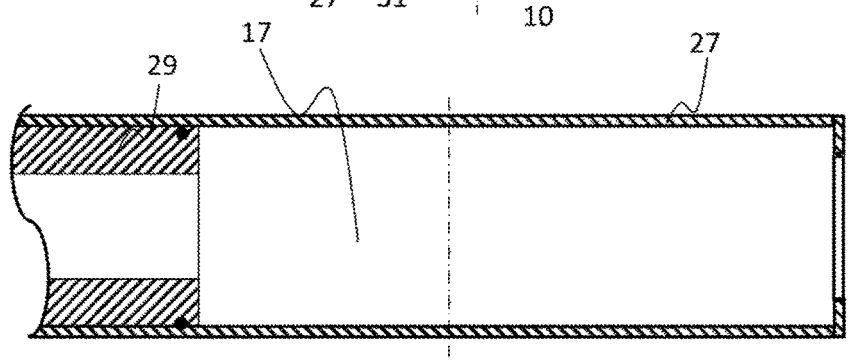
Figure 4C:
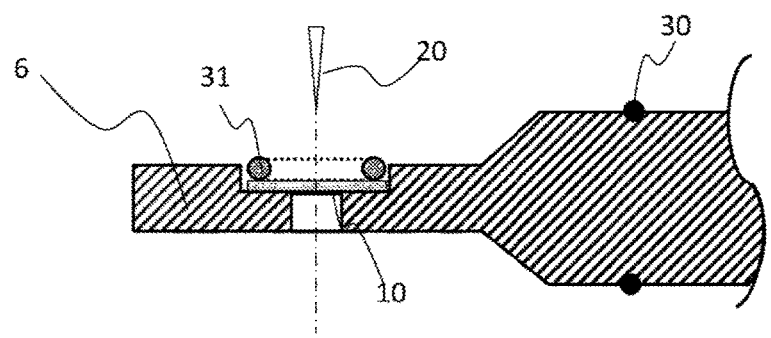

FIGS. 4(a) to 4(c) show an embodiment of the reverse side entry portion 17 including a sample atmosphere blocking mechanism. FIG. 4(a) is a configuration diagram, FIG. 4(b) is a sectional view of a sample atmosphere blocking portion 27 at the tip of the reverse side entry portion 17, and FIG. 4(c) is a sectional view of the sample holder 6. The reverse side entry portion is linked to the pump 15 or a gas cylinder via the valve 14. The sample atmosphere blocking portion 27 is provided at the tip of the reverse side entry portion 17. The sample atmosphere blocking portion 27 can be moved horizontally by an external control 28 and combined like surrounding the tip portion of the sample holder 6 and the sample 10. The reverse side entry portion 17 is removable from the sample chamber 12 and when inserted, the reverse side entry portion 17 is first inserted, into the reverse side entry pre-evacuation chamber 18 before being inserted into the sample chamber 12 while the valve 14 is closed to evacuate air from inside a body shaft 29 of the reverse side entry portion 17 and pipes individually. Then, the reverse side entry portion 17 is inserted into the sample chamber and the valve is opened.

The tip of the reverse side entry portion 17 has a hollow structure and moves horizontally around the body shaft 30 of the reverse side entry portion 17. By combining in a position where an O ring 30 on the side of the sample holder 6 and the sample atmosphere blocking portion 27, the atmosphere of the sample chamber 12 and the atmosphere of the sample 10 can be blocked. After the atmosphere is blocked, a gas can be injected into the surroundings of the sample 10 from a gas cylinder via a gas injection port and then, by exhausting air after switching the cylinder and the vacuum pump, the influence of irradiation of the electron beam 20 on the sample 10 can be reduced as much as possible and the sample 10 in a gas atmosphere before and after changes can be observed. Here, as shown in FIG. 4c, the sample holder 6 is described as the standard type in which the sample 10 is fixed by a ring spring 31, but by adopting a sample heating holder for the side of the sample holder 6, changes of the sample 10 in a gas atmosphere at high temperature can be observed in the same field of view. In addition, like the embodiment shown in FIGS. 2(a) and 2(b), the voltage applying mechanism may be added so that changes of the sample 10 while a voltage is applied in a gas atmosphere can be observed in the same field of view. Because a reaction is allowed only inside the sample atmosphere blocking portion 27, any reaction experiment may be conducted without affecting the device body.

Figure 5A:
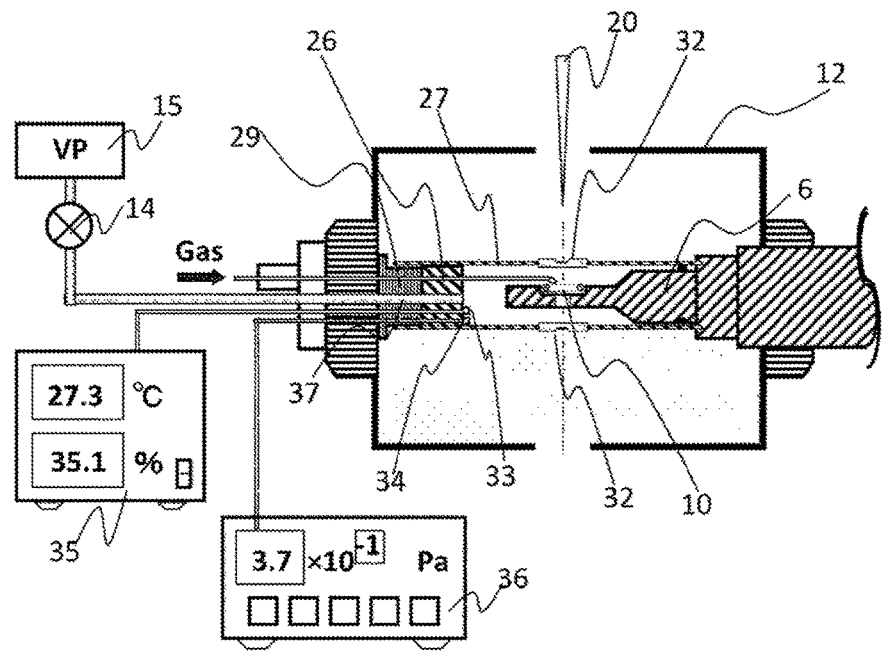
FIGS. 5A and 5B show the reverse side entry portion 17 and the sample holder 6 provided with a cell membrane 32 made of a light element through which an electron beam 20 can pass according to an embodiment.
Figure 5B:
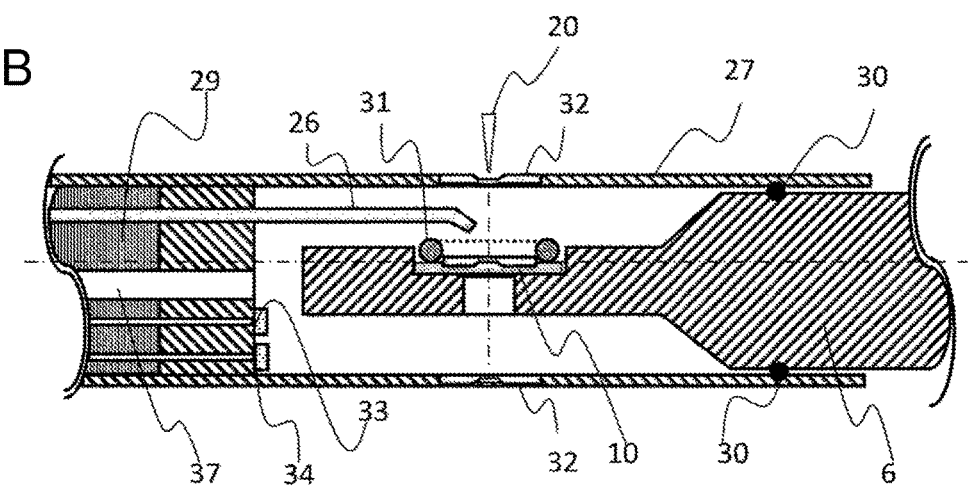

FIGS. 5(a) and 5(b) show an embodiment including a sample atmosphere blocking mechanism provided with a cell membrane 32 made of a light element through which the electron beam 20 can pass in a portion of the reverse side entry portion 17. The cell membrane 32 through which the electron beams 20, 21 can pass is mounted in a portion to be an electron beam path in the reverse side entry portion 17 and the atmospheres of the sample chamber 12 and the sample 10 are blocked to form cells. In this state, a transmitted image can be observed. The gas nozzle 26 to inject a gas, a temperature-humidity sensor 33, and a micro vacuum gauge 34 are mounted inside the cell and each is connected to controllers 35, 36 outside the column. The reverse side entry portion 17 includes a hollow evacuation hole 37 connected to the vacuum pump 15 via the valve 14. Accordingly an in-situ observation of chances of the sample 10 can be made while injecting any gas into the cell and monitoring the temperature and humidity and the cell internal pressure by the temperature-humidity sensor 33 and the micro vacuum gauge 34 respectively. By adopting a voltage applying or heating holder for the side of the sample holder 6, an in-situ observation of voltage application or heating in any atmosphere can be made.

Figure 6A:
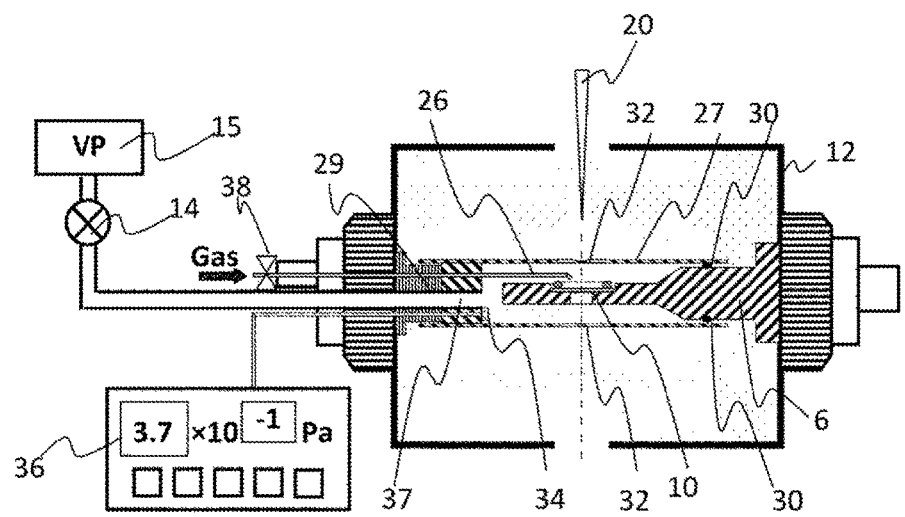
FIGS. 6A and 6B show the reverse side entry portion 17 and the sample holder 6 with a plasma generator according to an embodiment.
Figure 6B:
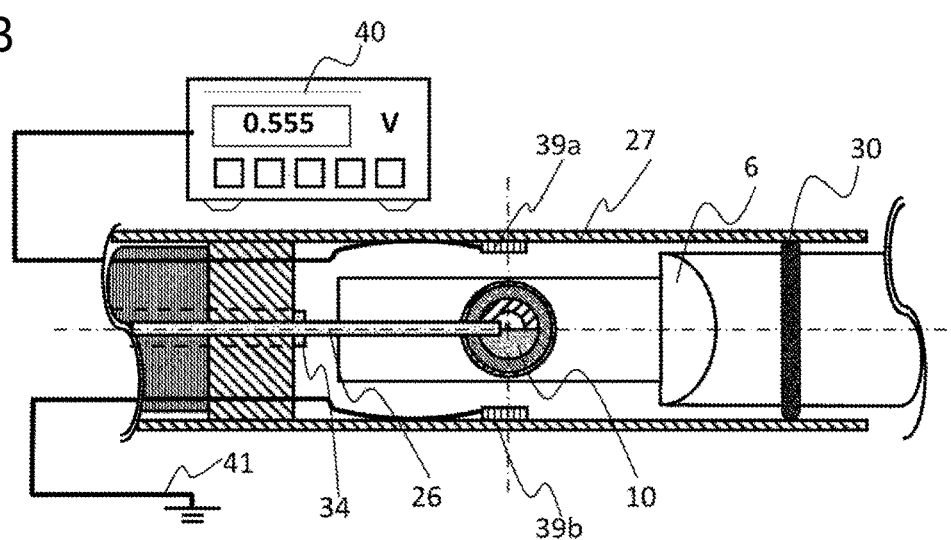

FIGS. 6(a) and 6(b) show an embodiment of providing a plasma generator in the reverse side entry portion 17. FIG. 6(a) is a configuration diagram and FIG. 6(b) is a top view of an internal configuration. The reverse side entry portion 17 includes the sample atmosphere blocking portion 27 including the cell membrane 32 allowing the electron beams 20, 21 to vertically transmit the sample 10 and made of ceramics. The gas injection nozzle 26, the evacuation hole 37, and the micro vacuum gauge 34 are included inside the blocked cell. The gas injection nozzle 26 is connected to a cylinder of the air containing oxygen ($O_2$) or a mixed gas of oxygen ($O_2$) and Ar via a needle valve 38. As shown in FIG. 6(b), a pair of plasma electrodes 39a, 39b is provided on the inner wall of the sample atmosphere blocking portion 27 on both sides of the position of the sample 10 and each electrode is connected to a high frequency generating power source 40 or grounded 41. Oxygen injected from the gas injection nozzle 26 becomes plasma and generated active oxygen reacts with CH adsorbed by the sample holder 6 and the sample 10 to become a contamination factor and exhausted from the evacuation hole 37 as $H_2O$, CO, or $CO_2$. Then, by taking the reverse side entry portion 17 out of the sample chamber 12, an observation and analysis without contamination can be made.

Figure 7A:
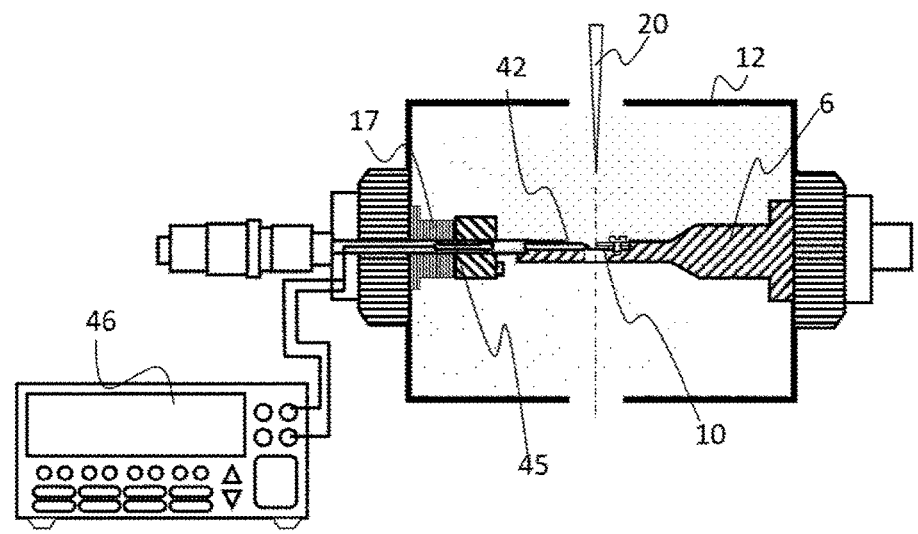
FIGS. 7A to 7C show the reverse side entry portion 17 and the sample holder 6 with a mechanism of applying stress according to an embodiment.
Figure 7B:
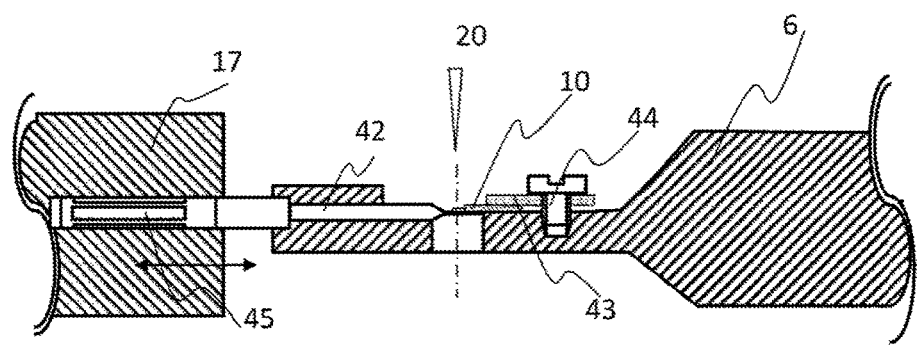
Figure 7C:
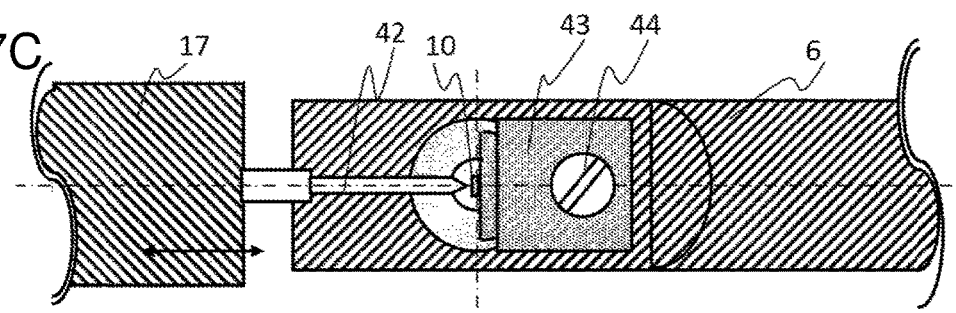

FIGS. 7(a) to 7(c) show an embodiment in which the reverse side entry portion 17 is provided with a mechanism to apply stress to the sample 10. FIG. 7(a) is a configuration diagram, FIG. 7(b) is a sectional view, and FIG. 7(c) is a top view of an internal configuration. In this case, the sample 10 is fixed to the sample holder 6 facing a stress applying portion 42 by a sample presser foot fixing screw 44 via a sample presser foot 43. The position of the stress applying portion 42 provided in the reverse side entry portion 17 is moved in the X, Y, and Z directions by a piezoelectric element 45. The piezoelectric element 45 is connected to a stress applying power source 46 and the stress applying power source 43 operates the piezoelectric element 45 such that necessary applied stress is added. Though not shown in the drawing, an in-situ observation of changes of the sample 10 by applying stress in a gas atmosphere can be made by adding the gas injection nozzle 26.

Figure 8A:
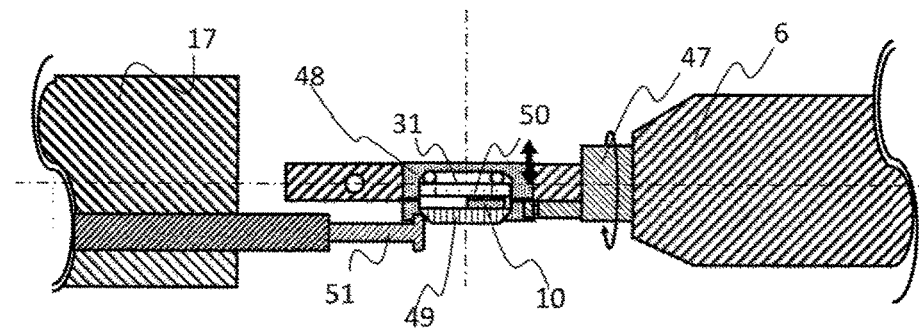
FIGS. 8A to 8C show the reverse side entry portion 17 and the sample holder 6 with a sample rotating mechanism according to an embodiment.
Figure 8B:
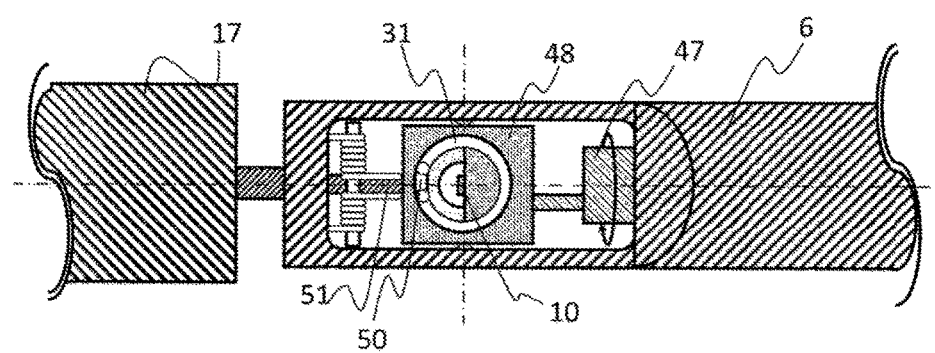
Figure 8C:
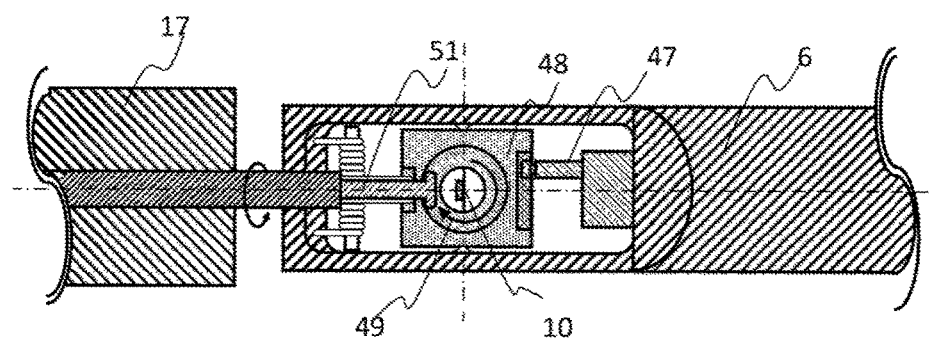

FIGS. 8(a) to 8(c) show an embodiment in which the reverse side entry portion 17 is provided with a sample rotating mechanism. FIG. 8(a) is a configuration diagram, FIG. 8(b) is a top view, and FIG. 8(c) is a bottom view. The sample holder 6 unit includes a sample biaxial leaning mechanism 47. A gear mechanism 49 to rotate the sample 10 is included on the undersurface of a sample stage portion 48 of the sample holder 6 on which the sample 10 is placed, a groove of the size of the sample 10 is included immediately above the gear mechanism 49, and the sample 10 is placed in the groove to be fixed to the sample stage portion 48 after a washer 50 and the ring spring 31 being placed thereon. The reverse side entry portion 17 has a gear 51 that rotates around the axis at the tip thereof and the sample 10 fixed to the sample holder 6 can be rotated by meshing the gear 51 with the gear mechanism 49 provided on the undersurface of the sample stage portion 48 inside the sample chamber 12 and rotating the gear 51 provided in the reverse side entry portion 17. Accordingly, if the crystal plane of the sample 10 is not aligned with a zone axis in the incident electron beam direction by performing biaxial leaning of the sample 10, the sample 10 is first rotated and then, the gear 51 portion provided in the reverse side entry portion 17 is removed and leaned so as to be able to be aligned with the zone axis within the range of biaxial inclination angle.

Figure 9A:
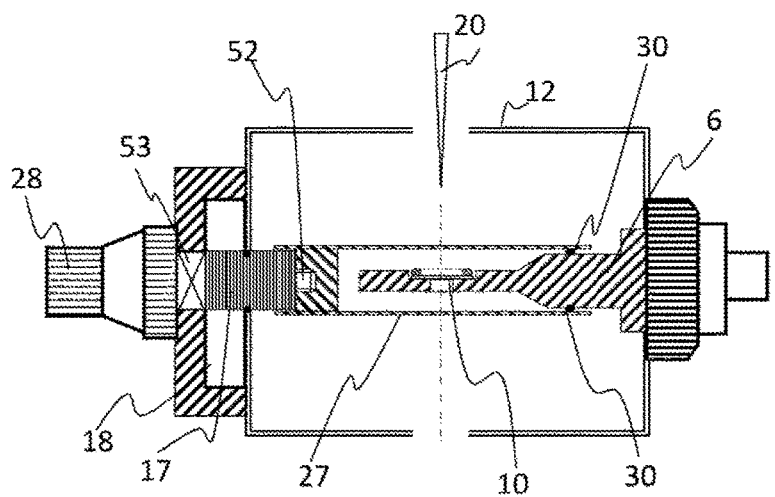
FIGS. 9A and 9B show the reverse side entry portion 17 and the sample holder 6 with a removable atmosphere blocking portion 27 according to an embodiment.
Figure 9B:
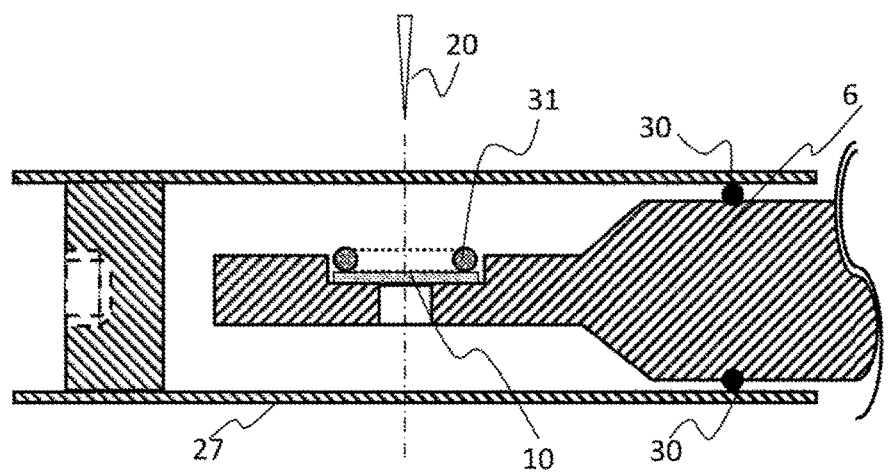

FIGS. 9(a) and 9(b) show an embodiment in which the reverse side entry portion 17 is provided with the atmosphere blocking portion 27 that can be removed. FIG. 9(a) is a configuration diagram and FIG. 9(b) is a sectional view in a state in which the atmosphere blocking portion 27 is separated from the reverse side entry portion 17. A portion that blocks the atmosphere of the sample 10 is fixed to the reverse side entry portion 17 by a screw 52 and the atmosphere blocking portion 27 and the reverse side entry portion 17 are separated by rotating the screw 52 counterclockwise using the external control 28. When the reverse side entry portion 17 is taken out after the separation, a valve 53 mounted in the reverse side entry pre-evacuation chamber 18 is closed and the reverse side entry portion 17 is taken out of the device. The atmosphere blocking portion 27 having been separated can be removed from the device while being fixed to the sample holder 6 and the sample atmosphere being blocked. After being removed from the device, the sample 10 can be transported in the air while the atmosphere is blocked by transporting the atmosphere blocking portion 27 to another vacuum device or charged particle beam device and mounting the atmosphere blocking portion 27 on the reverse side entry portion 17 in the device.

Figure 10A:
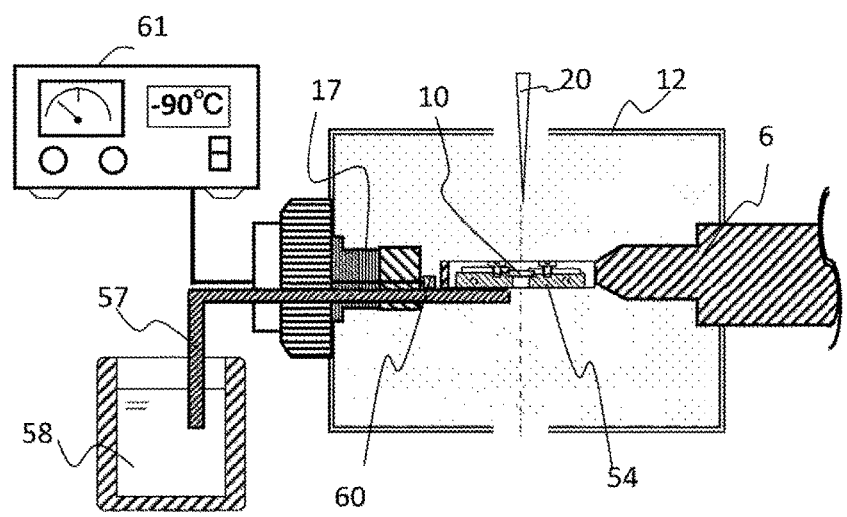
FIGS. 10A to 10C show the reverse side entry portion 17 and the sample holder 6 with a sample cooling mechanism according to an embodiment.
Figure 10B:
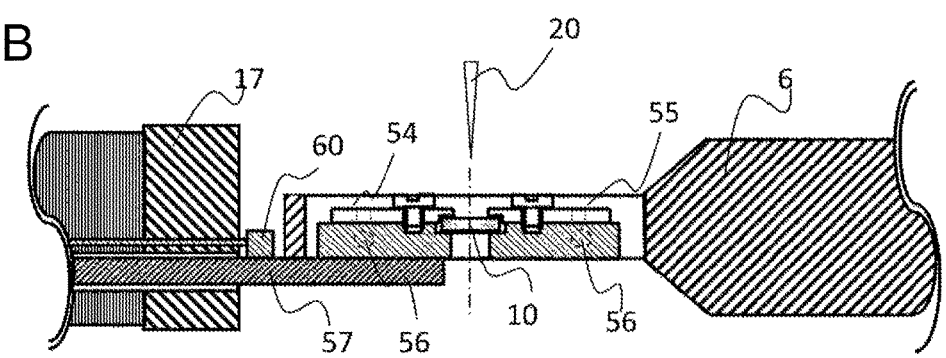
Figure 10C:
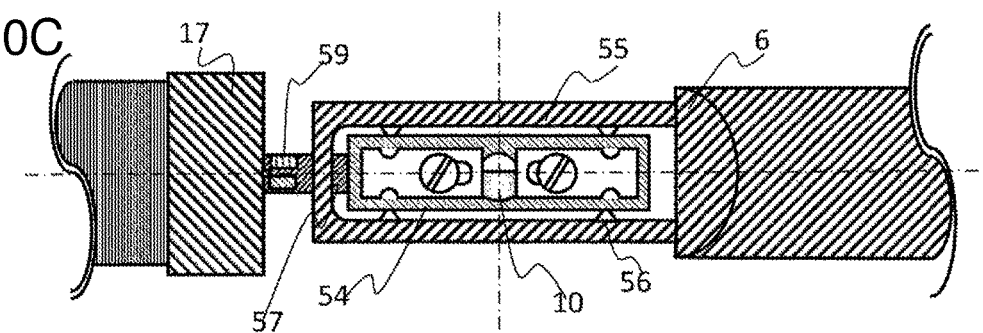

FIGS. 10(a) to 10(c) show another embodiment in which a sample cooling mechanism is included in the reverse side entry portion 17. FIG. 10(a) is a configuration diagram, FIG. 10(b) is a sectional view, and FIG. 10(c) is a top view. The sample 10 is fixed to a sample support 54 having high thermal conductivity. The sample support 54 is pivot 56 fixed to a frame 55 of the sample holder 6 and heat insulated. A cooling portion 57 in contact with the sample support 54 and having high thermal conductivity is mounted on the reverse side entry portion 17 and is connected to a cooling medium 58 outside the sample chamber 12. The cooling portion 57 includes a heater 59 and a thermocouple 60 for temperature measurement and is connected to a temperature controller 61 outside the sample chamber 12. The thermocouple 60 measures the temperature of the cooling portion 57 and the measured temperature is displayed in a temperature display unit of the temperature controller 61. The sample cooling temperature is adjusted by the heater 59. If the sample holder 6 is taken out of the sample chamber 12 while the sample 10 is cooled, a problem of frost formed near the sample 10 and the holder 6 arises and thus, the sample 10 is taken out after the sample 10 being brought back to room temperature by the heater 59 in the sample chamber 12.

In the foregoing, in addition to various capabilities described, the reverse side entry portion according to an embodiment may be provided with a detection function to detect a signal.

In the above embodiments, the reverse side entry portion inserted into the device can be removed and inserted regardless of various capabilities and thus, for example, the sample can be observed after plasma-cleaning the sample using Embodiment 6 and next, changes of the sample by applying a voltage can be observed using Embodiment 5 and then, a gas is injected and changes of the sample by applying a voltage in a gas atmosphere can be observed. When used for a device in which differential pumping mechanism is not enhanced, observations in any atmosphere can be made by further adding an atmosphere blocking mechanism with a cell membrane.

REFERENCE SIGNS LIST 1 electron microscope
2 electron gun
3 condenser lens
4 objective lens
5 projector lens
6 sample holder for electron microscope
7 fluorescent screen
8 TV camera
9a image display unit
9b image recording unit
10 sample
11 aperture for differential pumping
12 electron microscope sample chamber
13 observation chamber
14 valve
15 vacuum pump
16 sample pre-evacuation chamber
17 reverse side entry portion
18 reverse side entry pre-evacuation chamber
19 voltage applying power source
20 incident electron beam
21 transmitted electron beam 22 sample contact portion
23a electrode
23b electrode
23a' electrode
23b' electrode
24a electrode
24b electrode
25 sample presser foot
26 gas injection nozzle
27 sample atmosphere blocking portion
28 external control
29 body shaft
30 O ring
31 ring spring
32 cell membrane
33 temperature-humidity sensor
34 micro vacuum gauge
35 temperature-humidity sensor controller
36 micro vacuum gauge controller
37 evacuation hole
38 needle valve
39a plasma electrode
39b plasma electrode
40 high frequency generating power source
41 ground
42 stress applying portion
43 sample presser foot
44 sample presser foot fixing screw
45 piezoelectric element
46 stress applying power source
47 biaxial leaning mechanism
48 sample stage portion
49 gear mechanism
50 washer
51 gear
52 atmosphere blocking portion fixing screw
53 valve
54 sample support
55 frame
56 pivot
57 cooling portion
58 cooling medium
59 heater
60 thermocouple
61 temperature controller

The invention claimed is:

1. A charged particle beam device and a sample holder for the charged particle beam device comprising:
  a charged particle source that emits a primary charged particle beam;
  a charged particle control means for converging a charged particle beam emitted from the charged particle source and irradiating a sample with the charged particle beam;
  an image forming means for forming a sample image of the sample based on a transmitted portion of the charged particle beam that passes through the sample;
  a display means for displaying the sample image;
  a means for recording the displayed sample image;
  a sample holding means for holding the sample; and
  a removable side entry portion configured to change a state of the sample mounted on the sample holding means and to be removable from the sample holding means;
  wherein the removable side entry portion has a sample atmosphere blocking portion surrounding the sample holding means and separating an atmosphere of a sample chamber from an atmosphere of the sample,
  wherein the removable side entry portion includes at least two pairs of electrode terminals that apply a voltage to the sample,
  wherein the at least two pairs of electrode terminals are arranged in a portion fixing a micro-sample of a sample holding portion or a neighborhood thereof to be connected to the micro-sample by a metal wire when combined with the sample holding means, and
  wherein the at least two pairs of electrode terminals are connected to a voltage applying power source outside an electron microscope.

2. The charged particle beam device and the sample holder for the charged particle beam device according to claim 1,
  wherein the removable side entry portion is provided with a gas injection mechanism.

3. The charged particle beam device and the sample holder for the charged particle beam device according to claim 1,
  wherein a cell membrane of a light-element thin film is included in the removable side entry portion and with the cell membrane being arranged on a charged particle axis when combined with the sample holding means and a gas pressure space different from a vacuum is formed in the charged particle beam device.

4. The charged particle beam device and the sample holder for the charged particle beam device according to claim 1,
  wherein the removable side entry portion is provided with a micro vacuum gauge.

5. The charged particle beam device and the sample holder for the charged particle beam device according to claim 4,
  wherein the removable side entry portion is provided with a temperature-humidity sensor.

6. The charged particle beam device and the sample holder for the charged particle beam device according to claim 1,
  wherein the removable side entry portion is provided with a stress applying function to apply stress.

7. The charged particle beam device and the sample holder for the charged particle beam device according to claim 1,
  wherein the removable side entry portion is provided with a gear arranged so as to mesh with a micro-gear mounted on a sample support of the sample holder and the sample support can be rotated.

8. The charged particle beam device and the sample holder for the charged particle beam device according to claim 1,
  wherein the removable side entry portion includes a removable tip portion that is dividable into two portions in the sample chamber of the charged particle beam device, on the side of the sample holder.

9. The charged particle beam device and the sample holder for the charged particle beam device according to claim 1,
  wherein the removable side entry portion is provided with a mechanism to cool a tip portion of the sample holder; and
  wherein the sample holder includes a sample mounting contact portion, made of an insulating material, on which the sample is disposed.

10. A charged particle beam device and a sample holder for the charged particle beam device comprising:

a charged particle source that emits a primary charged particle beam;

a charged particle control means for converging a charged particle beam emitted from the charged particle source and irradiating a sample with the charged particle beam;

an image forming means for forming a sample image of the sample based on a transmitted portion of the charged particle beam that passes through the sample;

a display means for displaying the sample image;

a means for recording the displayed sample image;

a sample holding means for holding the sample; and a removable side entry portion including a function to change a state of the sample mounted on the sample holding means from a side facing the sample holding means;

wherein an electrode plate facing an inner side of the removable side entry portion is provided, a control unit is connected to one electrode via a high frequency generator, another electrode is installed, and a sample portion of the sample holding means is arranged between the electrodes to be able to generate plasma between the electrodes and clean the sample and a tip portion of the sample holding means.

* * * * *